US012031753B2

(12) United States Patent
Rush et al.

(10) Patent No.: US 12,031,753 B2
(45) Date of Patent: Jul. 9, 2024

(54) EVAPORATIVE THERMAL MANAGEMENT SYSTEMS AND METHODS

(71) Applicant: GE Aviation Systems LLC, Grand Rapids, MI (US)

(72) Inventors: Brian Magann Rush, Niskayuna, NY (US); Stefano A. Lassini, Lowell, MI (US)

(73) Assignee: GE Aviation Systems LLC, Grand Rapids, MI (US)

( * ) Notice: Subject to any disclaimer, the term of this patent is extended or adjusted under 35 U.S.C. 154(b) by 407 days.

(21) Appl. No.: 17/397,475

(22) Filed: Aug. 9, 2021

(65) Prior Publication Data

US 2023/0038664 A1 Feb. 9, 2023

(51) Int. Cl.
*F25B 19/00* (2006.01)
*H05K 7/20* (2006.01)

(52) U.S. Cl.
CPC .......... *F25B 19/00* (2013.01); *H05K 7/20309* (2013.01); *H05K 7/20381* (2013.01)

(58) Field of Classification Search
CPC ................ F25B 19/00; H05K 7/20381; H05K 7/20327; F28D 2021/0029; F28D 2021/0064
See application file for complete search history.

(56) References Cited

U.S. PATENT DOCUMENTS

| 2,925,722 | A | | 2/1960 | Blackburn | |
|---|---|---|---|---|---|
| 3,066,499 | A | * | 12/1962 | Fisher | F25B 23/006 174/15.1 |
| 5,349,831 | A | | 9/1994 | Daikoku | |
| 5,398,519 | A | * | 3/1995 | Weber | H05K 7/20381 62/99 |
| 6,533,029 | B1 | | 3/2003 | Phillips | |
| 6,994,151 | B2 | | 2/2006 | Zhou | |
| 9,835,363 | B2 | | 12/2017 | Xiao | |
| 10,515,871 | B1 | | 12/2019 | Joshi | |
| 10,746,479 | B2 | | 8/2020 | Rush | |
| 2014/0268572 | A1 | | 9/2014 | Ranjan | |

(Continued)

FOREIGN PATENT DOCUMENTS

| EP | 3218929 | 9/2017 |
|---|---|---|
| WO | 200438318 | 5/2004 |
| WO | 201651569 | 4/2016 |

*Primary Examiner* — Lionel Nouketcha
(74) *Attorney, Agent, or Firm* — Fitch, Even, Tabin & Flannery LLP

(57) ABSTRACT

Devices and methods are provided herein useful to thermal management. In some embodiments, a thermal management device includes a housing with a fixed amount of working fluid disposed therein. The substrate is in thermal communication with the thermal management device such that evaporation of the working fluid controls the temperature of the substrate. Evaporated working fluid exits the housing through one or more vents. The housing further includes a plurality of supports that increase the surface area to volume ratio of the housing. The high surface area to volume ratio of the housing increases the rate of heat transfer and also minimizes or otherwise reduces the size and weight of the thermal management device. The supports may further serve to mechanically support the substrate, enabling the housing to act as a combined thermal and mechanical device.

20 Claims, 19 Drawing Sheets

(56) References Cited

U.S. PATENT DOCUMENTS

2019/0021188 A1    1/2019  Phan
2019/0170406 A1*   6/2019  Wilson .................... F25B 19/00
2020/0350229 A1*  11/2020  Chang ................. H01L 23/3733

* cited by examiner

EVAPORATIVE THERMAL MANAGEMENT SYSTEMS AND METHODS

TECHNICAL FIELD

This technical field relates generally to thermal management systems and, more specifically, to thermal management systems for applications requiring low or optimized size, weight, and power.

BACKGROUND

Thermal management systems may employ forced and natural convection, conduction, or radiation to transfer heat to or from a substrate. Passive thermal management systems typically rely on additional thermal mass, for example, in the form of a working fluid, which adds physically mass and size, to control temperatures. In addition, active thermal management systems may rely on additional equipment such as pumps, heat exchangers, or condensers to circulate a working fluid. The addition of mass may be a challenge for applications that require low or optimized size, weight, and power (SWaP).

Therefore, there remains a desire to have a passive thermal management system that efficiently controls the temperature of a substrate while minimizing the size, weight, and power of the system.

Figure 1:
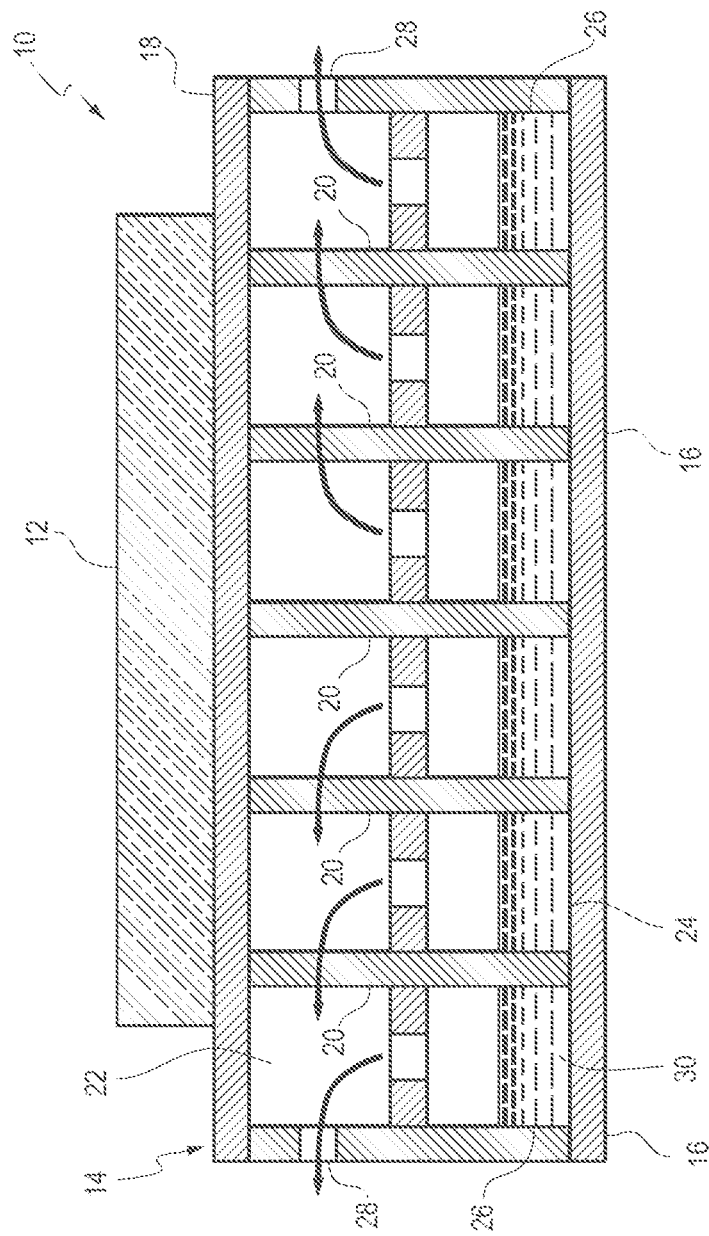
FIG. 1 is a schematic diagram of an embodiment of an evaporative thermal management device having a top substrate configuration.

Elements in the figures are illustrated for simplicity and clarity and have not necessarily been drawn to scale. For example, the dimensions and/or relative positioning of some of the elements in the figures may be exaggerated relative to other elements to aid in understanding various embodiments. Also, common but well-understood elements that are useful or necessary in a commercially feasible embodiment are often not depicted to facilitate a less obstructed view of these various embodiments.

DETAILED DESCRIPTION

With reference to FIGS. 1-5, there is illustrated an evaporative thermal management device 10 that controls the temperature of a substrate 12, which may be a heat source, while minimizing or otherwise reducing the device's size and weight. The evaporative thermal management device 10 includes a housing 14 with a working fluid 30 disposed therein. The substrate 12 is in thermal communication with the evaporative thermal management device 10 such that evaporation of the working fluid 30 controls the temperature of the substrate 12. Evaporated working fluid 30 exits the housing 14 through one or more vents 28. The housing 14 further includes a plurality of supports 20. The plurality of supports 20 increase the surface area to volume ratio of the housing 14. The high surface area to volume ratio of the housing 14 increases the rate of heat transfer and also minimizes or otherwise reduces the size and weight of the evaporative thermal management device 10 by minimizing or otherwise reducing the amount of working fluid 30 required for heat transfer. The supports 20 may further serve to mechanically stiffen the housing 14 and support the substrate 12, enabling the housing 14 to act as a combined thermal and mechanical device.

Turning back to FIG. 1, the evaporative thermal management device 10 includes the housing 14. The housing 14 may be formed in any shape that is complementary to the shape or geometry of the substrate 12. The housing 14 may also be formed into three-dimensional (3D) shapes to conform to a particular space or volume and to form specific functions. For example, the housing 14 or portions thereof may be formed into a narrow conduit to serve as a vent tube or a vapor liquid separator. In some forms, the housing 14 may include an opening disposed therethrough that is configured to receive one or more substrates 12. In other forms, the housing 14 may be configured to receive a substrate on its top surface and/or on its bottom surface. The housing 14 includes a base case 16 and a top case 18. The top case 18 is spaced from and opposite the base case 16. The cases 16, 18 may be formed from sheets of material in any suitable shape or configuration.

The housing 14 further includes the plurality of supports 20, which extend from the base case 16 to the top case 18 and form a cavity 22 therebetween. The cavity 22 is bounded by walls 26 and a base 24. The supports 20 may be formed in a variety of geometries and arrangements. In some approaches, the geometry and arrangement of the supports 20 may be designed to mechanically stiffen the housing 14 and/or to support a particular substrate 12. Accordingly, the housing 14 may act as a both a thermal device and a support structure for the substrate 12. That is, the housing 14 may both facilitate heat transfer and bear the weight of the substrate 12. The supports 20 depicted in FIGS. 1-5 are cylindrical columns. However, the supports 20 may be any suitable shape such as rectangular columns, triangular columns, branched structures, I-beams, L-shaped beams, trihedron structures, etc. The cross-sectional area of the supports 20 may be uniform or non-uniform.

The working fluid 30 is disposed in the cavity 22 of the housing 14. The working fluid 30 may be any suitable heat transfer fluid. Suitable working fluids 30 may include water, alcohols (e.g., methanol, ethanol, propanol) as well as mixtures thereof. Other suitable working fluids 30 include other fluids having a high latent heat of vaporization including, for example, ethylene glycol, glycerin, ammonia, or acetone. Working fluids 30 with a higher boiling point, such as glycerin, may be more suitable for applications having a higher threshold temperature. Working fluids 30 with a lower boiling point, such as ammonia, may be more suitable for applications having a lower threshold temperature. In some embodiments, the working fluid 30 may include buffers or other additives.

The boiling point or saturation temperature ($T_{sat}$) of the working fluid 30 in the evaporative thermal management device 10 may be controlled by the type of working fluid 30 and the operating pressure of the evaporative thermal management device 10, that is, a pressure at which the evaporative thermal management device 10 operates. In some approaches, the working fluid 30 may be selected based, at least in part, on a threshold temperature associated with the substrate 12. The threshold temperature may be a desired working temperature for the substrate 12. In some approaches, the evaporative thermal management device 10 may be designed to keep the substrate at or below the threshold temperature. In operation, boiling and evaporation of the working fluid 30 may maintain the substrate 12 at or below the threshold temperature. Accordingly, a particular working fluid 30 may be selected to achieve the threshold temperature for the substrate 12 at a particular operating pressure of the evaporative thermal management device 10. In some aspects, the working fluid 30 has a boiling point (i.e., saturation temperature) at or below the threshold temperature at the operating pressure of the device.

In some approaches, the amount of working fluid 30 disposed in the housing 14 may achieve a wetted surface area to volume ratio sufficient to dissipate a particular heat load for a particular duration of time. In some approaches, the wetted surface area to volume ratio of the housing 14 may be greater than 100 1/m and, in some aspects, may be in the range of about 100 to 10,000 1/m.

The housing 14 also includes one or more vents 28. The vents 28 may be separate from or integral with the housing 14; for example, the housing 14 may morph into the vents 28. The vents 28 may be in fluid communication with the ambient environment surrounding the housing 14. The vents 28 act exit ports through which evaporated working fluid 30 may exit the evaporative thermal management device 10. The vents 28 may be formed in either the top case 18 or the base case 16 of the housing 14. In FIG. 2, the vents 28 are shown in an open configuration, allowing evaporated working fluid 30 to freely exit the cavity 22. However, it is also contemplated that the vents 28 may be sealed. The vents 28 may be sealed, for example, for storage purposes before the evaporative thermal management device 10 is placed in operation. In some embodiments, the vents 28 may be sealed with a valve such as a squib valve (not shown) which may be actuated to allow evaporated working fluid to flow out of the cavity 22 to the ambient environment 34. While the vents 28 are included on the top case 18 in FIG. 1, it is contemplated that the vents 28 may be disposed on any portion of the housing 14. In some approaches, the position of the vents 28 may depend on the orientation of the evaporative thermal management device 10 during operation. For example, the vents 28 may be positioned to prevent working fluid 30 that is in the liquid state from flowing out of the housing 14 in a particular orientation.

Figure 14:
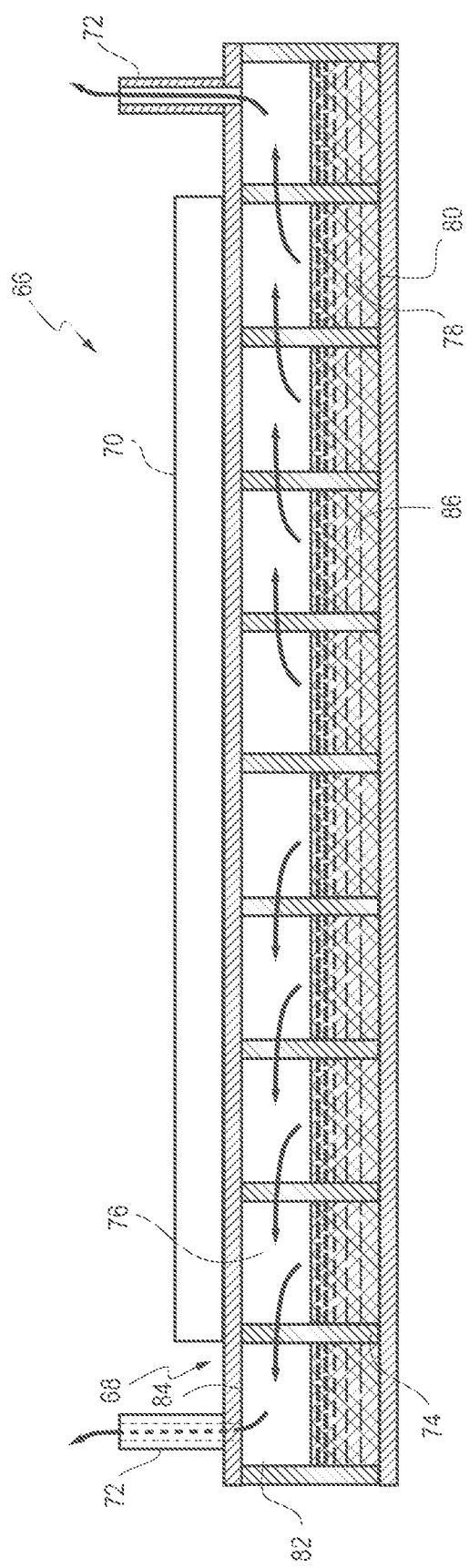
FIG. 14 is a schematic diagram of another embodiment of an evaporative thermal management device including a working liquid held in a porous media domain.
Figure 15:
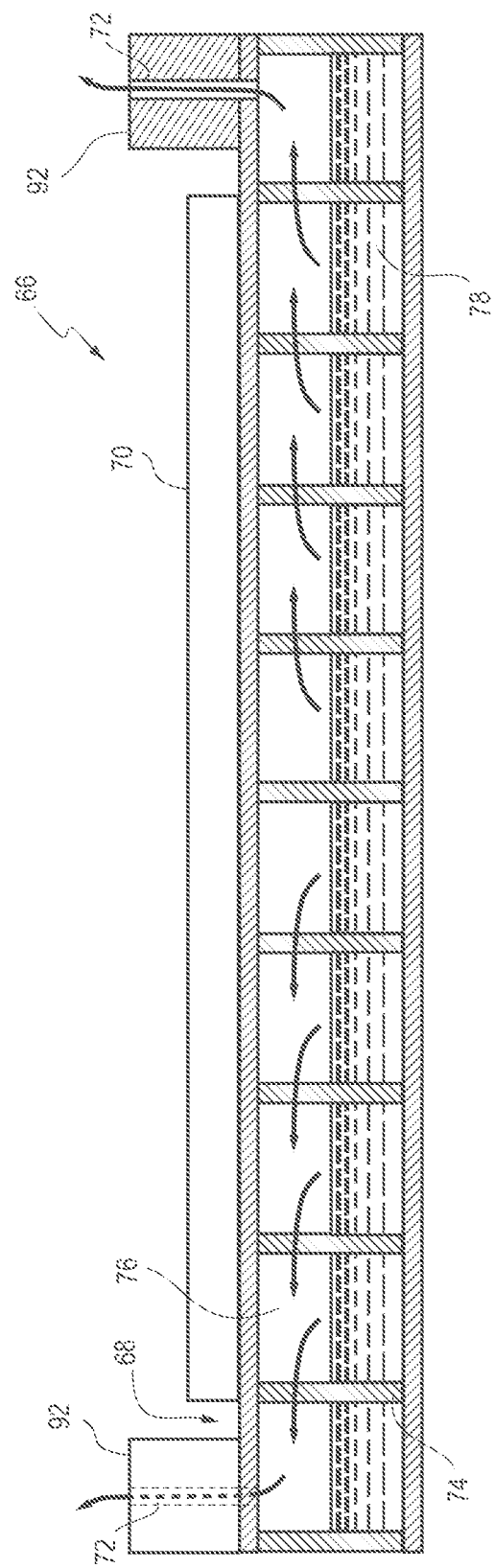
FIG. 15 is a schematic diagram of an embodiment of an evaporative thermal management device equipped with a pressure relief valve.

In some embodiments, the vents 28 expose the cavity 22 of the evaporative thermal management device 10 to a pressure of the ambient environment 34. Thus, the operating pressure of the evaporative thermal management device 10 may be the pressure of the ambient environment 34. In other embodiments, the vents 28 may be pressure regulated. To achieve pressure regulation, the vents 28 may be equipped with pressure regulating devices (such as pressure relief valve 92 and venturi pump 94) for example, as shown in FIGS. 14 and 15. The pressure regulating devices may control the operating pressure of the evaporative thermal management device 10. The vents 28 may be used to expose the working fluid to the targeted saturation pressure (Plat), for example, that yields a saturation temperature equal to or less than the threshold temperature for the substrate 12.

The evaporative thermal management device 10 is in thermal communication with one or more substrates 12. The substrate 12 may be in thermal communication with any portion of the evaporative thermal management device 10 so that heat may be transferred to and/or from the evaporative thermal management device 10 and the substrate 12. In some embodiments, the substrate 12 is a heat source or heat producing device. The substrate 12 may be, for example, an electronic device such as a silicon device, a microprocessor, an integrated circuit, or a semiconductor; however, it should be understood that the evaporative thermal management device 10 is not limited to use with such substrates. In some approaches, the substrate 12 may be an actuator, a battery (e.g., a thermal battery), a sensor (e.g., a navigation sensor, a mission sensor), or other temperature sensitive payloads.

In operation, the cavity 22 of the evaporative thermal management device 10 is filled with a fixed amount of working fluid 30. The working fluid 30 is heated by the substrate 12. The transfer of heat from the substrate 12 to the working fluid 30 cools the substrate 12 and causes the working fluid 30 to boil and evaporate. This boiling of the working fluid 30 maintains the substrate 12 at or near the boiling point temperature of the working fluid 30. In some approaches, the boiling point temperature of the working fluid 30 may be equal to or less than the threshold temperature for the substrate 12. The heated working fluid 30 boils and forms a vapor within the cavity 22. Evaporated working fluid 30 exists the cavity 22 of the evaporative thermal management device 10 through the vents 28. Evaporated working fluid 30 passes through the vents 28 to the ambient environment 34. When the evaporative thermal management device 10 is at ambient pressure (i.e., when vents 28 are not pressure regulated), the evaporative thermal management device 10 may employ a working fluid 30 having a saturation pressure at or below the ambient pressure when the evaporative thermal management device 10 is at or below the threshold temperature.

In some embodiments, when the vents 28 are pressure regulated (see FIGS. 14 and 15), pressure regulating devices (such as pressure relief valve 92 or venturi pump 94) control the operating pressure of the evaporative thermal management device 10. The pressure regulating devices may adjust the operating pressure of the evaporative thermal management device 10 to be at or below the saturation pressure of the working fluid 30, for example, at the threshold temperature. In this manner, the operating pressure of the evaporative thermal management device 10 controls the boiling point of the working fluid 30.

In operation, the evaporative thermal management device 10 is charged with a fixed amount of working fluid 30. The evaporative thermal management device 10 dissipates heat through evaporation of the working fluid 30 rather than through circulation of the working fluid 30. Accordingly, the evaporative thermal management device 10 does not require equipment such as pumps, secondary heat exchangers, and condensers for the working fluid 30. Because such equipment is not required, the weight of the thermal management is minimized.

Including the supports 20 in the housing 14 increases the surface area of the housing 14 that is in contact with the working fluid 30 and, accordingly, increases the rate of heat transfer. In some approaches, the housing 14 and supports 20 may be configured to provide a particular surface area in order to achieve a desired rate of heat transfer.

Because the evaporative thermal management device 10 is charged with a fixed amount of working fluid, the evaporative thermal management device 10 may be designed for operation for a predetermined period of time. The evaporative thermal management device 10 may be designed for a single use or multiple uses. In some embodiments, when the evaporative thermal management device 10 is employed to cool a component of an aircraft, the amount of working fluid 30 may be sufficient to sustain operation of the evaporative thermal management device 10 for the duration of a single trip or for multiple trips. The amount of working fluid 30 in the cavity 22 may be adjusted based on the rate of heat transfer and/or the desired duration of use. Thus, the amount of working fluid 30 charged into the cavity 22 may be sufficient to accommodate particular heat transfer rate (i.e., to dissipate a particular heat load) for the substrate 12 over a particular period of time.

Figure 2:
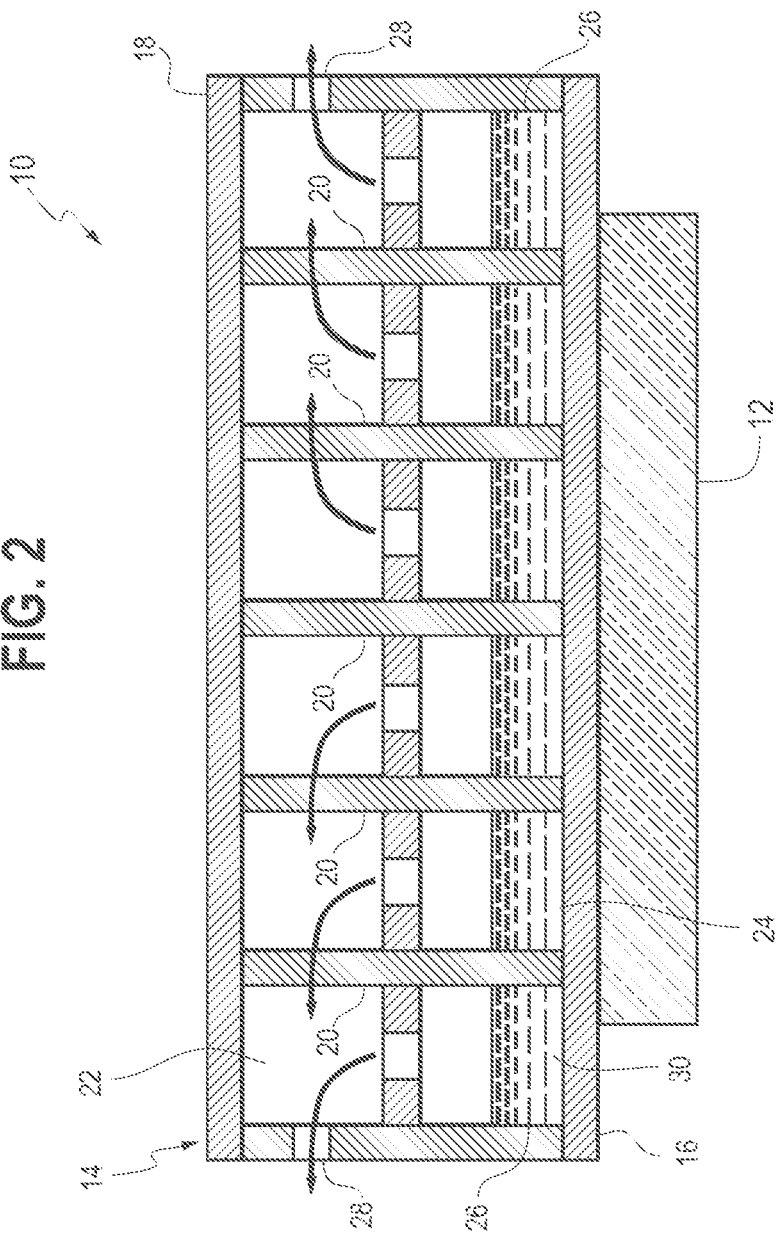
FIG. 2 is a schematic diagram of an embodiment of an evaporative thermal management device having a bottom substrate configuration.
Figure 3:
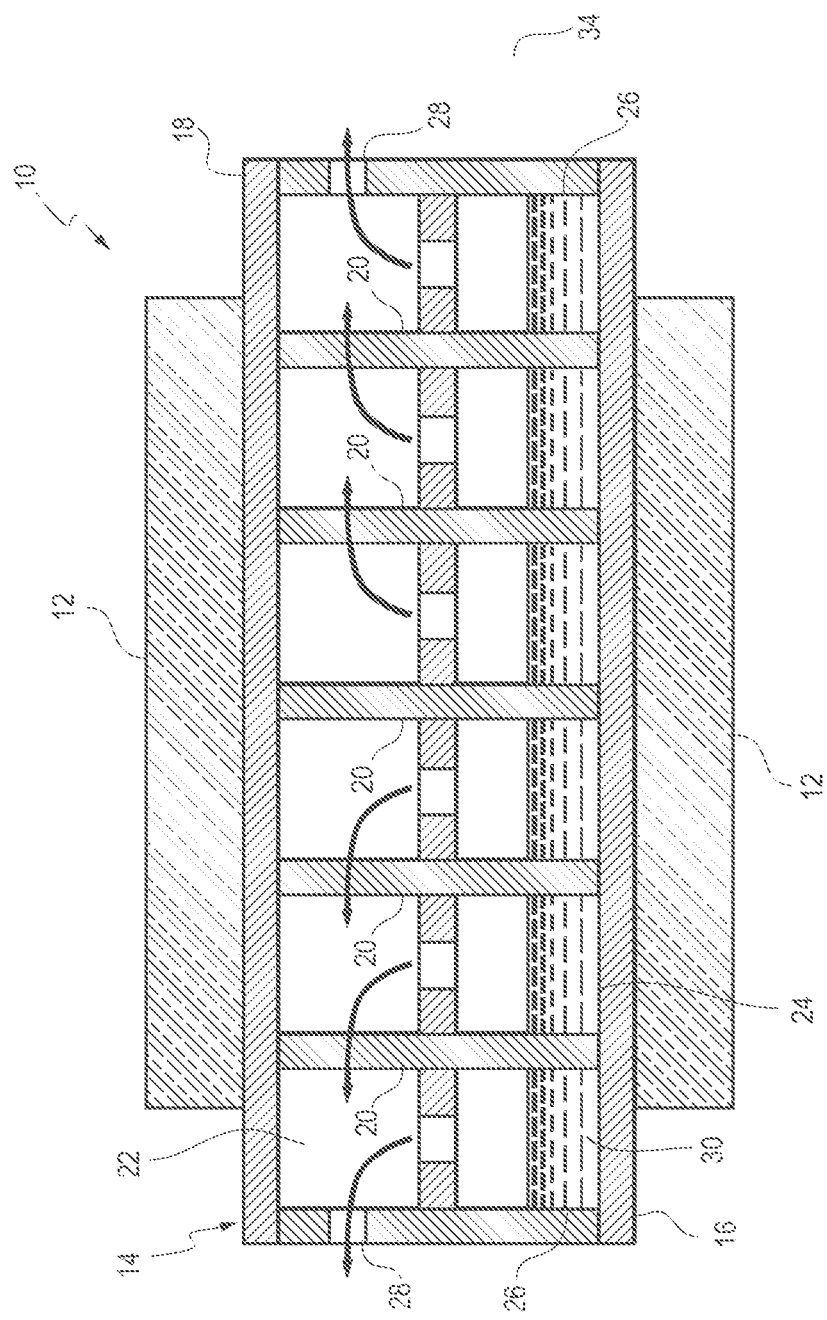
FIG. 3 is a schematic diagram of an embodiment of an evaporative thermal management device having a top and bottom substrate configuration.

FIGS. 1-3 illustrate exemplary substrate 12 configurations where the substrate(s) 12 are in thermal communication with the evaporative thermal management device 10. In FIG. 1, the substrate 12 is in contact with the top surface of the evaporative thermal management device 10. In such a configuration, the housing 14 acts as both a mechanical support and a heat transfer device for the substrate 12. In FIG. 2, the substrate 12 is in contact with a bottom surface of the evaporative thermal management device 10. In FIG. 3, two substrates 12 are in thermal communication with the evaporative thermal management device 10. One substrate 12 is in contact with the top surface and another substrate 12 is in contact with the bottom surface of the evaporative thermal management device 10. In some embodiments, one or more substrates 12 may be surrounded by the housing 14 or positioned within an opening in the housing 14.

Figure 4:
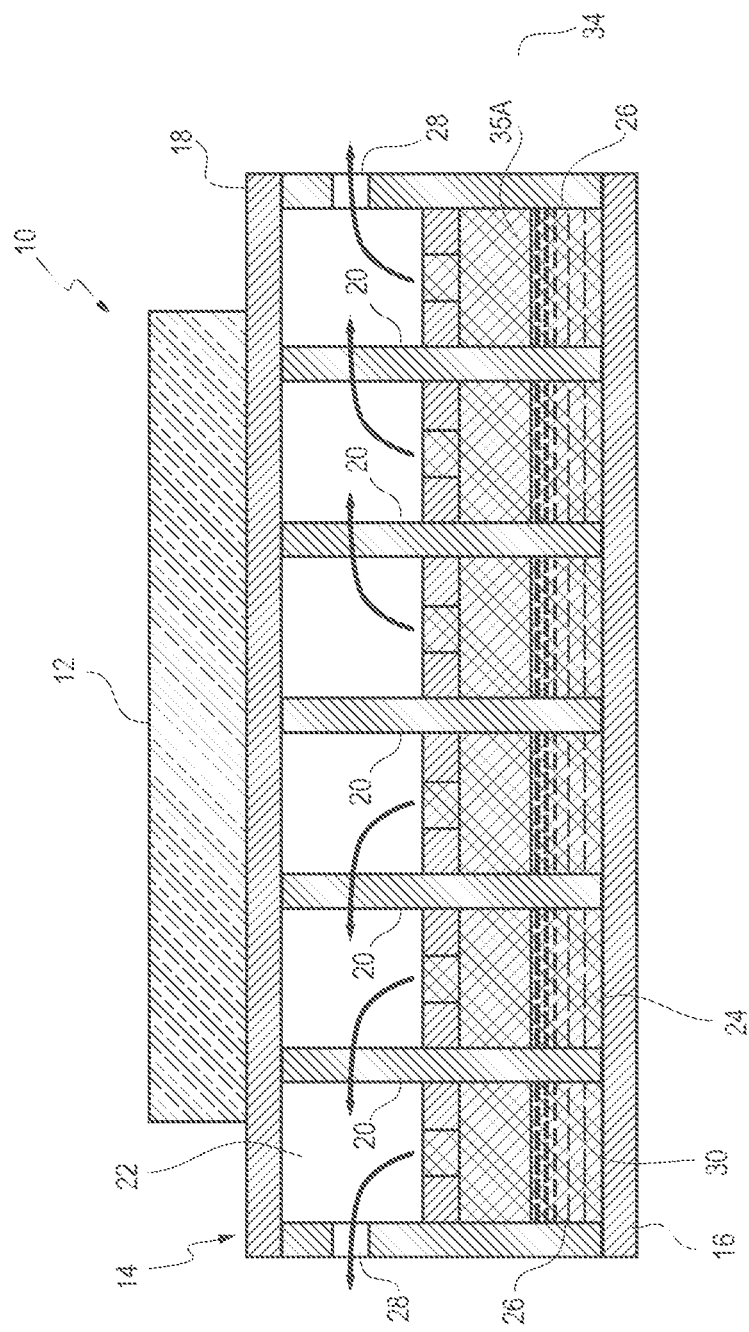
FIG. 4 is a schematic diagram of an embodiment of an evaporative thermal management device including a porous media domain.
Figure 5:
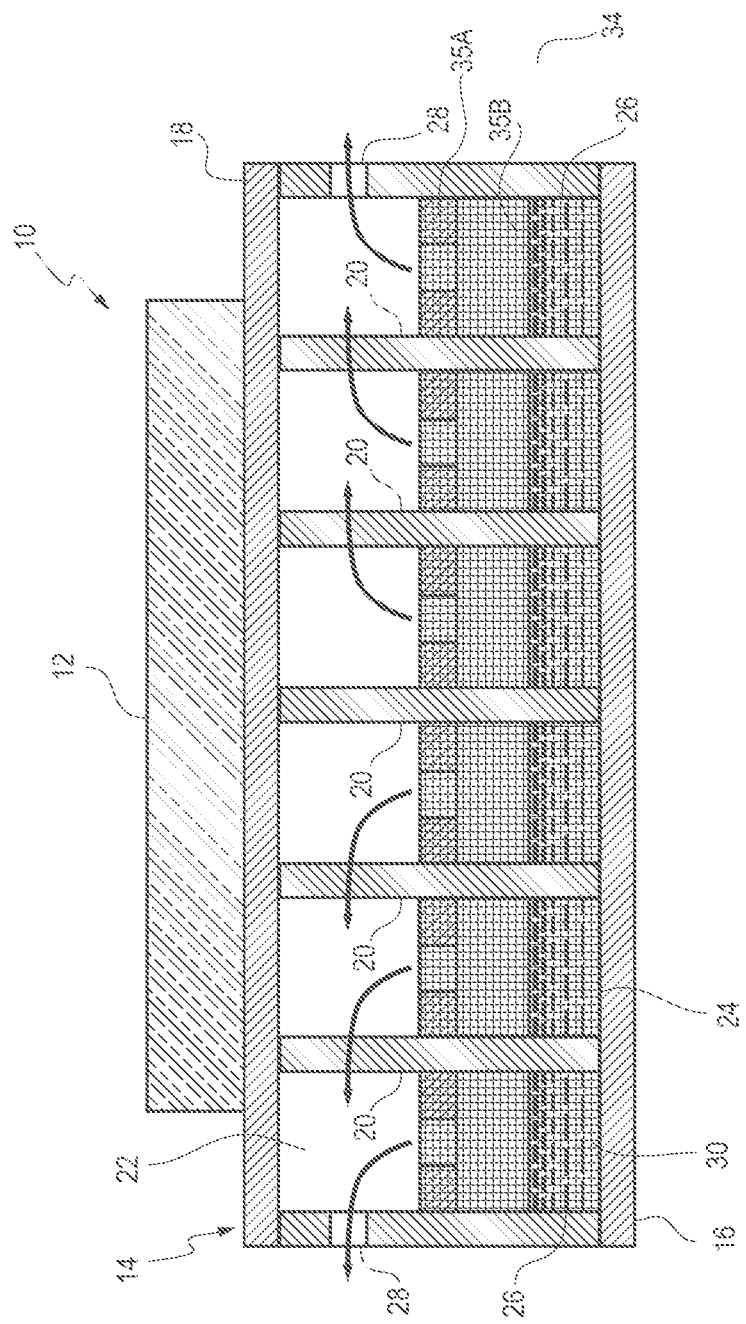
FIG. 5 is a schematic diagram of another embodiment of an evaporative thermal management device including a porous media domain.

Turning to FIGS. 4 and 5, the evaporative thermal management device 10 further includes at least one porous media domain. A porous media is used to create a porous media domain. The porous media may be any suitable porous structure such as, for example, a mesh structure, a gel structure, or combinations thereof. In FIG. 4, a fine porous media 35A is disposed in the cavity 22 of the housing 14. In FIG. 5, the fine porous media 35A and a coarse porous media 35B are disposed in the cavity 22. The porous media 35A, 35B may be attached to an interior surface of the housing 14 using any suitable attachment mechanisms. For example, the porous media 35A, 35B may be attached to the interior surface of the housing 14 by heat sealing, welding, brazing, adhesives, or any mechanical means. In some approaches, the ends of the porous media 35A, 35B may be hot dipped in brazing metal to enhance the thermal and mechanical contact with the housing 14.

The size of the pores in the porous media 35A, 35B may vary depending on the particular application or use of the evaporative thermal management device 10. A finer porous media, such as the porous media 35A, slows vapor removal from the cavity 22 and provides more containment of the working fluid 30, preventing movement of working fluid 30 within the cavity 22. A coarser porous media, such as the coarse porous media 35B, may speed up vapor removal and provides less containment of the working fluid 30, permitting more movement of the working fluid 30 within the cavity 22. The fine porous media 35A may be employed, for example, in an application in which the evaporative thermal management device 10 is subjected to a large amount of movement or to gravitational ("G") forces. By contrast, the coarse porous media 35B may be employed, for example, in an application subjected to a small amount of movement or G-forces. The pore size and/or density of the porous media 35A, 35B may also contribute to the rate of heat transfer from the substrate 12 to the working fluid 30. A denser porous media expedites the rate of heat transfer.

As illustrated in FIGS. 4 and 5, the porous media 35A, 35B confines the working fluid 30 to the base 24 of the housing 14. While the porous media 35A, 35B are disposed along the base 24 of the cavity 22 in FIGS. 4 and 5, it is contemplated that the porous media may be disposed in any portion of the cavity 22. In this manner, the porous media 35A, 35B may be used to confine the working fluid 30 to any portion of the cavity 22 in which the porous media 35A, 35B is positioned. In some embodiments, the porous media 35A, 35B is positioned to prevent or minimize the loss of working fluid 30 through the vents 28 prior to evaporation.

Figure 6:
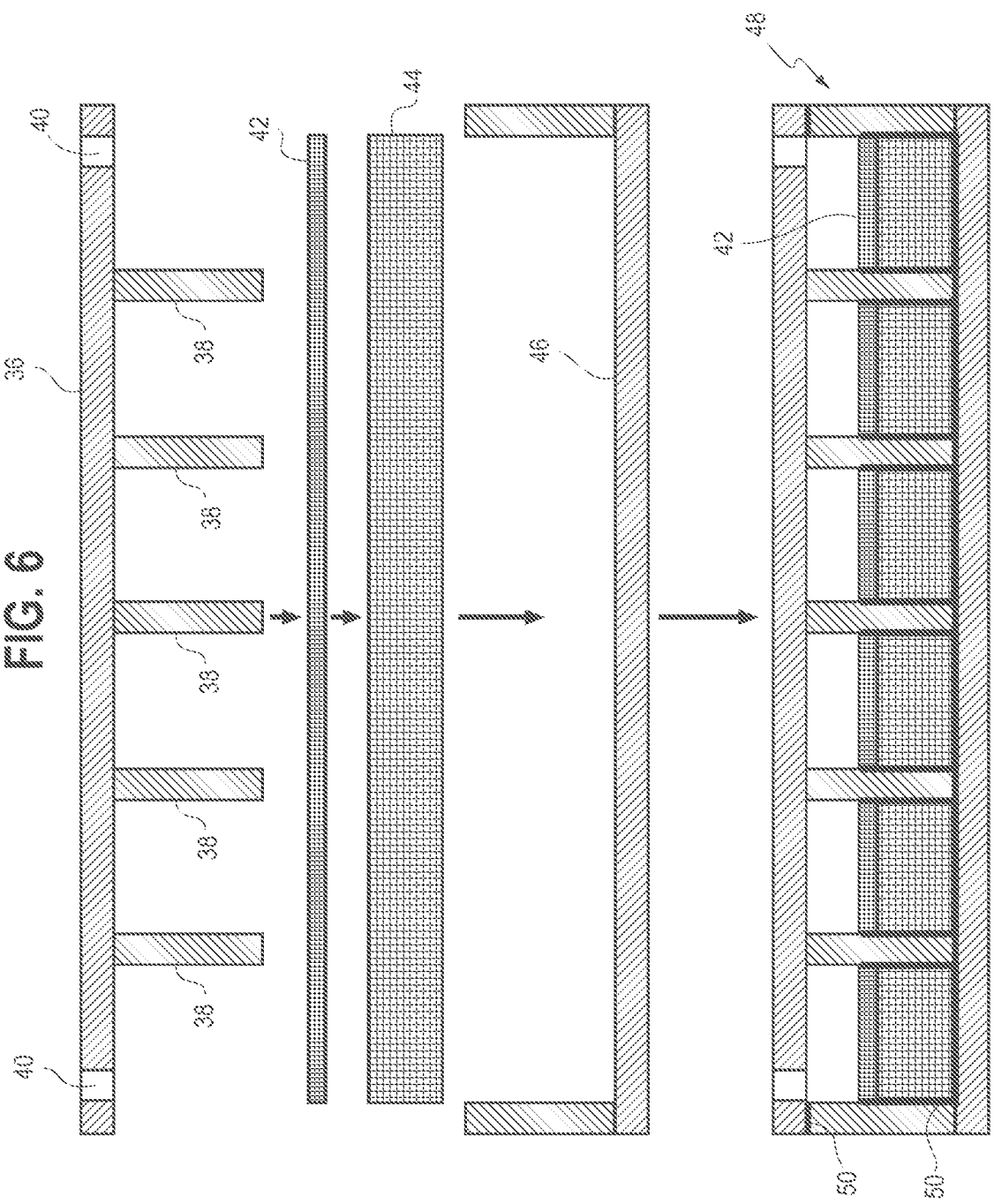
FIG. 6 is a schematic diagram of a two-piece housing of an evaporative thermal management device.

Turning to FIG. 6, an exploded view of an exemplary evaporative thermal management device 48 is illustrated. The evaporative thermal management device 48 includes a top case 36. Vents 40 are formed in the top case 36 and a plurality of supports 38 are coupled to a surface of the top case 36. In some embodiments, the top case 36 and the supports 38 are formed of a single piece of material. The evaporative thermal management device 48 also includes a base case 46. A first porous media 42 and a second porous media 44 are disposed in the interior of the evaporative thermal management device 48. The first porous media 42 and the second porous media 44 are positioned between the top case 36 and the base case 46. In some aspects, the first porous media 42 and the second porous media 44 are mesh layers, however, it is contemplated that other suitable porous structures such as gel structures may be used.

The top case 36 is coupled to the base case 46. Additionally, the first porous media 42 and the second porous media 44 are coupled to the base case 46. The top case 36 may be coupled to the base case 46, and the first porous media 42 and the second porous media 44 attached to the base case 46, by any suitable attachment mechanism 50. Suitable attachment mechanisms 50 may include brazing, welding, adhesives, or mechanical means. When the assembled, the first porous media 42 forms a partial containment lid for the evaporative thermal management device.

In some approaches, the first porous media 42 and the second porous media 44 are mesh layers. It is contemplated that the mesh layers may perform the same function as the porous media 35A, 35B described with reference to FIGS. 4 and 5.

It is contemplated that the top case 36, the base case 46, or portions thereof may be formed using any suitable manufacturing method. Suitable manufacturing methods may include, for example, additive manufacturing approaches such as 3D printing.

Figure 7:
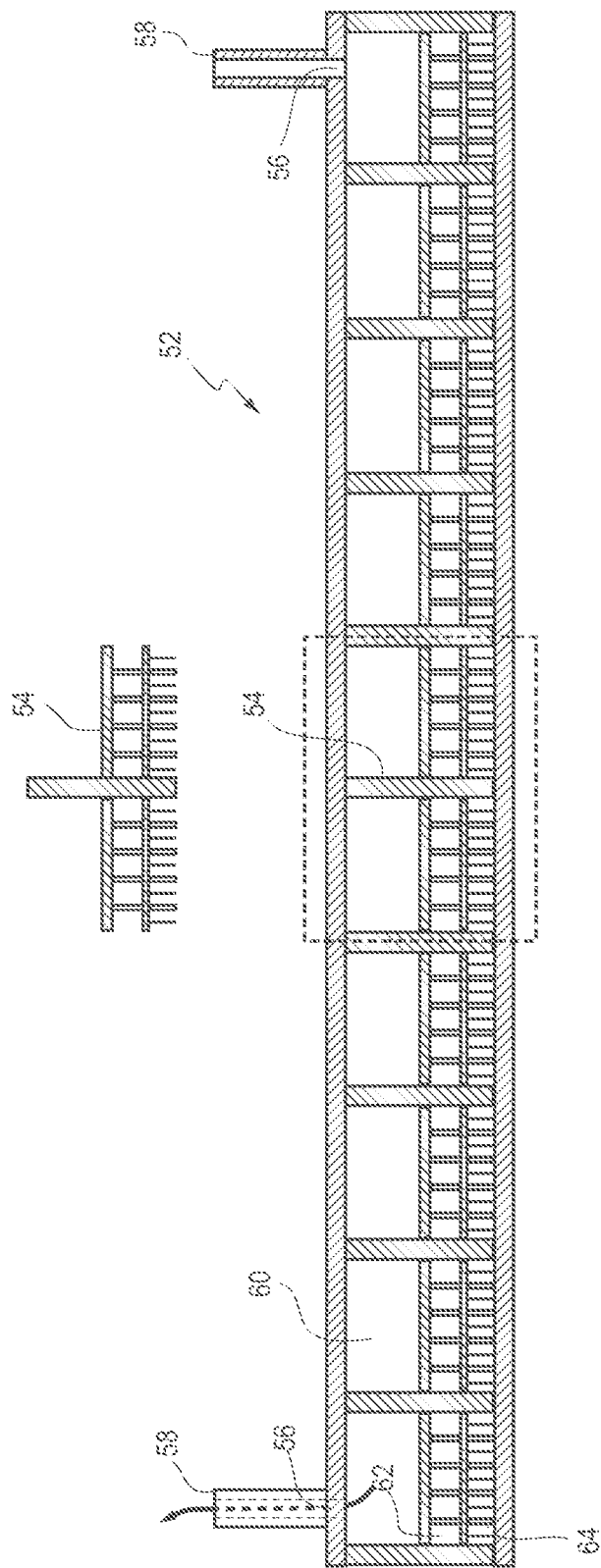
FIG. 7 is a schematic diagram of a housing of an evaporative thermal management device having branched supports.
Figure 8:
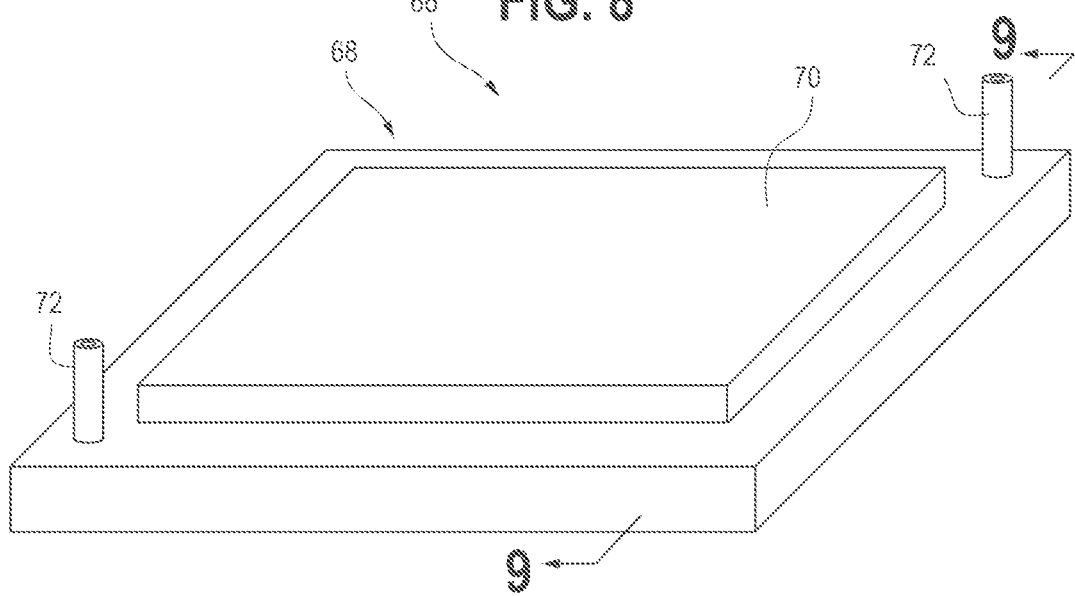
FIG. 8 is a perspective view of an embodiment of an evaporative thermal management device.

With reference to FIG. 7, an alternative embodiment of a housing 52 for the evaporative thermal management device 10 is illustrated. The housing 52 includes vents 56. The vents 56 are formed in the top portion of the housing 52. Vent tubes 58 are coupled to the vents 56. In FIG. 8, the vent tubes 58 are shown in an open configuration and without any pressure regulating devices coupled thereto. However, it is also contemplated that, in some embodiments, the vent tubes 58 may include pressure regulating devices, such as the pressure relief valve 92 and venturi pump 94 described with reference to FIGS. 14 and 15.

The housing 52 includes a plurality of branched supports 54 disposed in the cavity 60. The branched supports 54 include a forked distribution of support posts that create a porous domain in the bottom of the cavity 60. The branched supports 54 include wider spaced posts at the top and narrower spaced posts at the bottom. In this manner, the branched supports 54 create small pores 64 towards the bottom of the cavity 60 and large pores 62 towards the top of the cavity 60. The forked configuration of the branched supports 54 increases the rate of heat transfer through the branched supports 54 and also confines the working fluid to the bottom portion of the cavity 60. The branched supports 54 may also provide additional structural support for a substrate positioned on the top of the housing 52.

Figure 9:
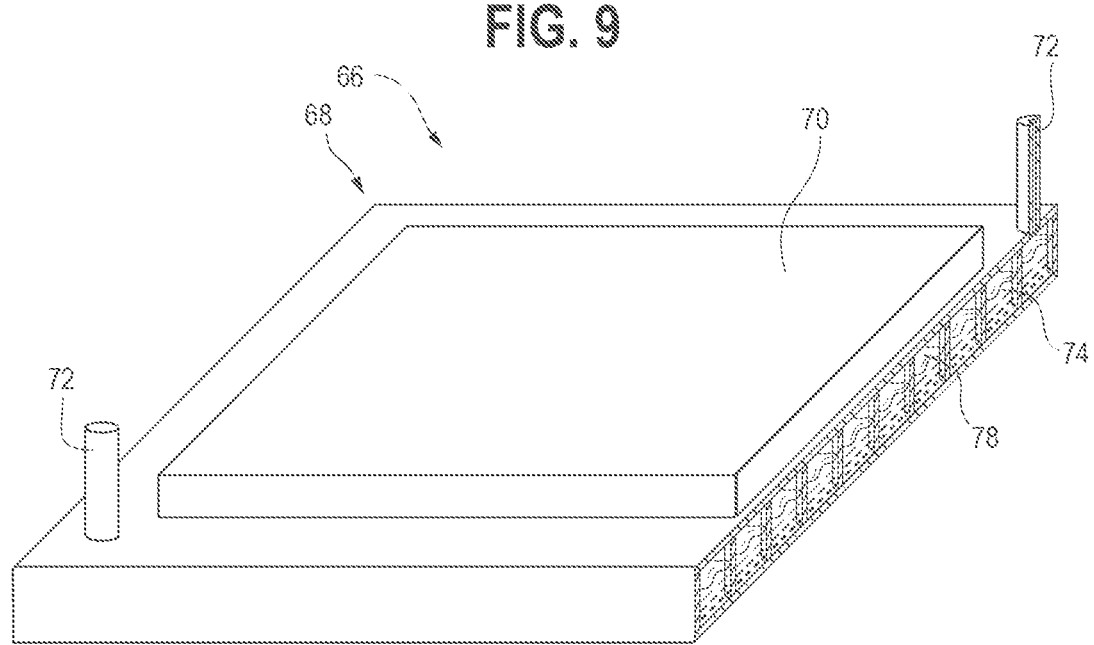
FIG. 9 is a breakaway view of the evaporative thermal management device of FIG. 8 taken along line 9-9.
Figure 10:
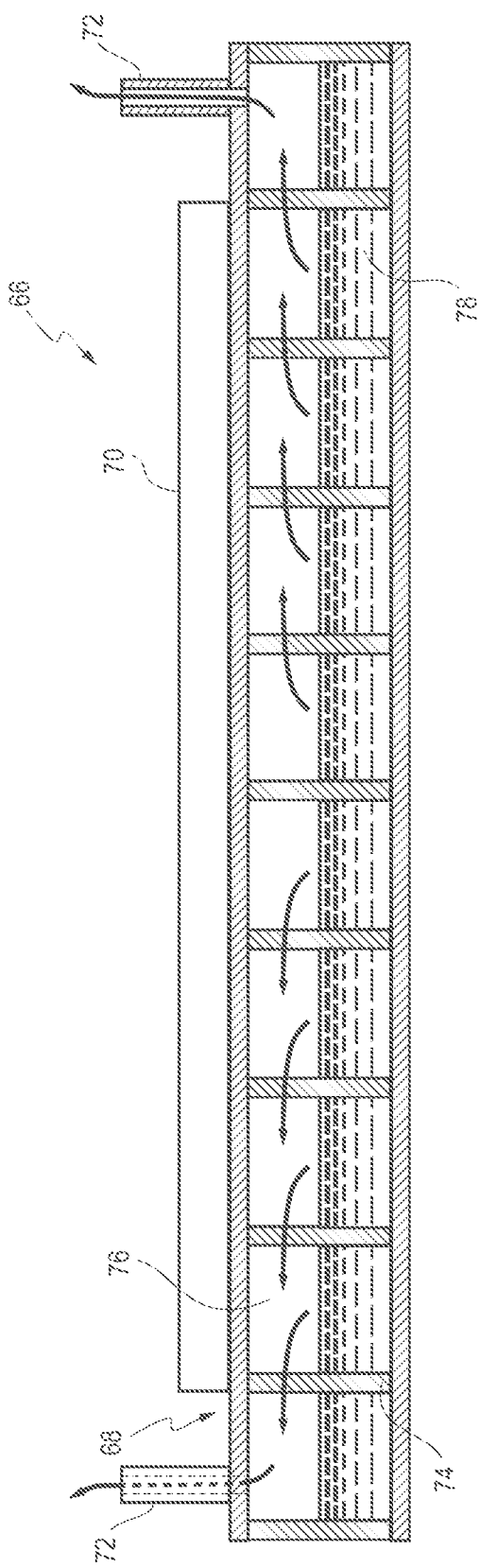
FIG. 10 is a schematic diagram of an embodiment of an evaporative thermal management device equipped with vent tubes.

With reference to FIGS. 8-10, another exemplary evaporative thermal management device 66 is illustrated. The evaporative thermal management device 66 includes a housing 68 that is in thermal communication with a substrate 70. The housing 68 includes plurality of supports 74. The supports 74 are cylindrical columns that are arranged in rows within the housing 68. Although the supports 74 are depicted in rows in FIGS. 8-10, the supports 74 may be positioned in any arrangement suitable to support the substrate 70, to provide a suitable surface area to volume ratio of the housing, to achieve a suitable heat transfer rate, and/or to provide another mechanical or structural function. The housing 68 also defines cavity 76 with a working fluid 78 disposed therein. A plurality of vent tubes 72 are coupled to the housing 68. The vent tubes 72 allow evaporated working fluid 78 to flow out of the cavity 76 to the ambient environment.

Figure 11:
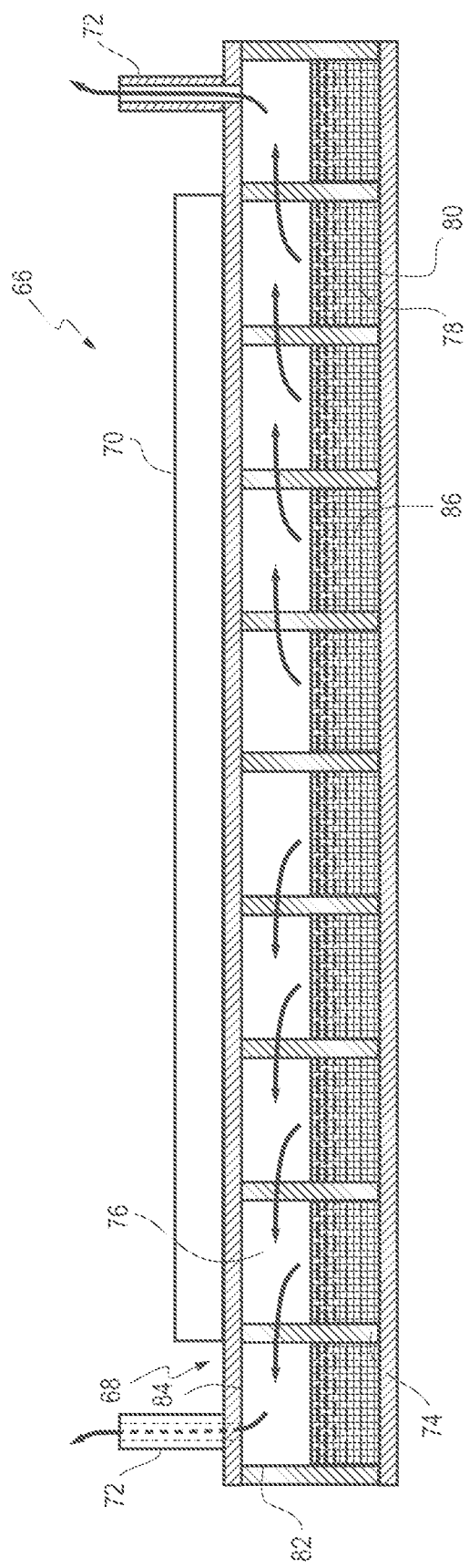
FIG. 11 is a schematic diagram of an embodiment of an evaporative thermal management device including a working liquid held in a porous media domain.
Figure 12:
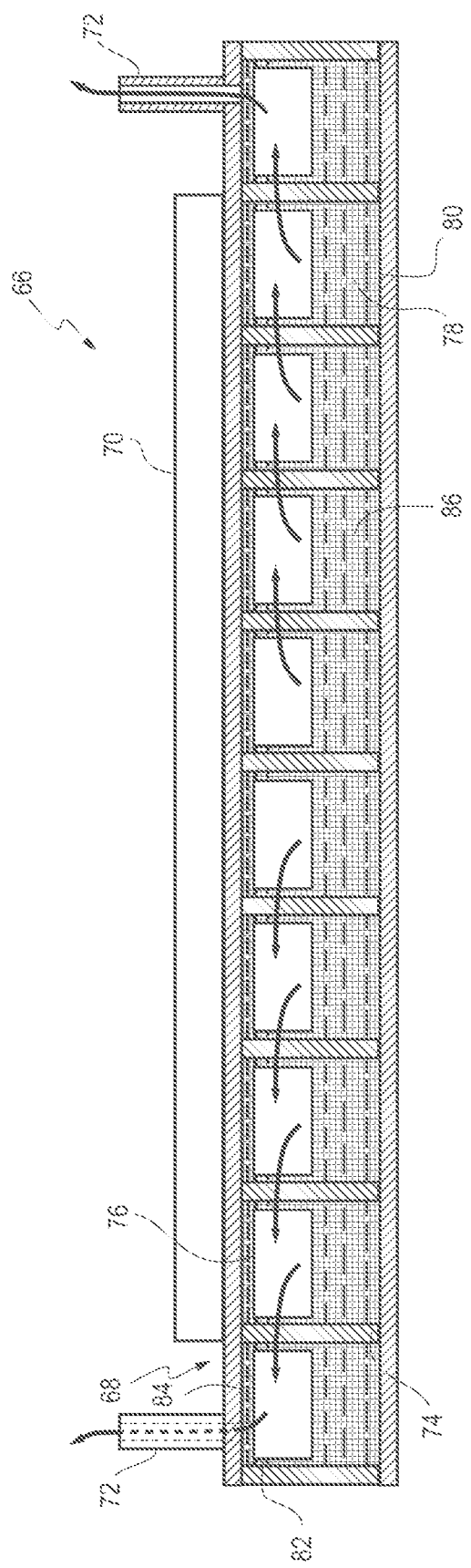
FIG. 12 is schematic diagram of another embodiment of an evaporative thermal management device including a working liquid held in a porous media domain.
Figure 13:
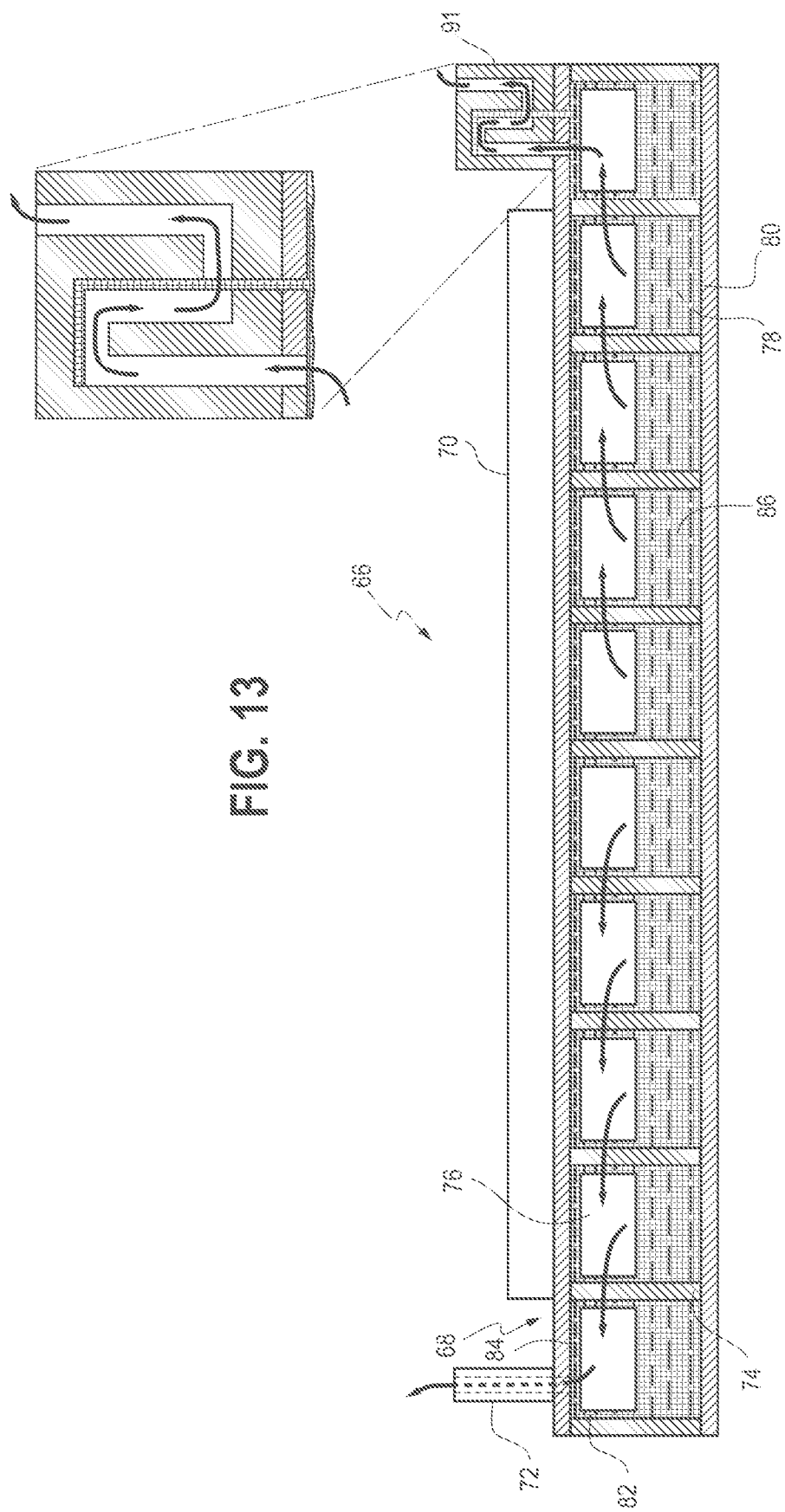
FIG. 13 is a schematic diagram of another embodiment of an evaporative thermal management device including a vapor-liquid separator.

With reference to FIGS. 11-13, the evaporative thermal management device 66 is illustrated with a variety of porous media disposed in the cavity 76. The porous media in the cavity 76 confines the working fluid 78 to a particular portion of the cavity 76. The porous media provides internal containment and helps to hold the working fluid domains in place within the cavity 76.

In FIG. 11, the cavity 76 includes a porous mesh structure 86 as the porous media. The porous mesh structure 86 is disposed along a floor 80 of the cavity 76 and fills a bottom portion of the cavity 76. The working fluid 78 may fill the porous mesh structure 86 or a portion thereof. In operation, the working fluid 78 is heated by the housing 68. The porous mesh structure 86 further conducts heat from the housing 68 through the working fluid 78. The heated working fluid 78 evaporates and travels through the porous mesh structure 86 and exits through the vent tubes 72 to the ambient environment.

In FIG. 12, the cavity 76 includes a porous mesh structure 88 as the porous media. The porous mesh structure 88 creates a porous media domain. The porous mesh structure 88 is disposed along the floor 80 of the cavity 76 and fills the bottom portion of the cavity 76. The porous mesh structure 88 also lines the walls 82 and the ceiling 84 of the cavity 76. The working fluid 78 may fill the porous mesh structure 88 or a portion thereof. In operation, the working fluid 78 is heated by the housing 68 and the porous mesh structure 88 further conducts heat from the housing through the working fluid 78. The heated working fluid 78 evaporates and travels through the porous mesh structure 88 and exits through the vent tubes 72 to the ambient environment.

Further, the porous mesh structure 88 distributes the working fluid 78 around the interior perimeter of the cavity, increasing the surface area of the cavity 76 that is contact with working fluid 78. The porous mesh structure 88 also covers the vent tube 72 opening to prevent working fluid 78 that is in the liquid state from escaping through the vent tube 72. When positioned in the manner, the porous mesh structure 88 also allows evaporated working fluid 78 that is in the gaseous state to exit through the vent tube 72. Capillary forces in the porous mesh structure 88 help to keep liquid working fluid 78 in the housing 68.

In addition to including a porous media to contain the working fluid 78 within the housing 68, one or more vent tubes 72 may include a structure or device to prevent non-evaporated working fluid 78 that is in the liquid state from escaping through the vents. In some approaches, one or more of the vents on any of the evaporative thermal management device described herein may include a vapor-liquid separator to remove liquids entrained in evaporated working fluid and/or to redirect the liquid back into the housing. In some aspects, the vapor-liquid separator may be a centrifugal-type separator. In some aspects, the vapor-liquid separator may include one or more baffles or impingement plates disposed in the vent. The vapor-liquid separator may also use a porous wick structure to collect liquid droplets and return them to the housing.

In FIG. 13, the evaporative thermal management device 66 includes a vapor-liquid separator 91. The vapor-liquid separator 91 may be separate from or integral with the housing 68, for example, the housing 68 may morph into the vapor liquid-separator 91. The vapor-liquid separator 91 may be any suitable vapor-liquid separation device or structure. The vapor-liquid separator 91 is coupled to a vent opening 93 on the housing 68. The vapor-liquid separator 91 includes baffles 97 that define a vent channel 95. The baffles 97 create a tortuous path through the vapor-liquid separator 91. The porous mesh structure 88 extends from the cavity 76 of the housing 68 across the vent channel 95.

In operation, the substrate 70 heats the working fluid 78 which causes the working fluid 78 to evaporate. Evaporated working fluid 78 exits the housing 68 through the vent tube 72 and the vapor-liquid separator 91. The evaporated working fluid 78 may include entrained liquids. The vapor-liquid separator 91 removes entrained liquids from the exiting gas stream. The porous mesh structure 88 acts as a wick structure to collect any liquid droplets that hit it and directs the liquids back into the housing 68.

Further, changes in the orientation of the evaporative thermal management device 66 may cause the vent tube 72 to become submerged in liquid working fluid 78. Submersion or other blockages in the vent tube 72 may prevent evaporated working fluid 78 from exiting. When evaporated working fluid 78 is trapped in the housing 68, the housing 68 may pressurize and force both evaporated and liquid working fluid 78 out of the vent opening 93. The vapor-liquid separator 91 deflects liquid working fluid 78 back into the housing 68 and remove liquid working fluid 78 from the exiting gas stream.

In FIG. 14, the cavity 76 includes a gel structure 90 as the porous media. The gel structure 90 creates a porous media domain. It is contemplated that the gel structure 90 may perform the same function as the porous media 35A, 35B described with reference to FIGS. 4 and 5. The gel structure 90 is disposed along the floor 80 of the cavity 76 and fills a bottom portion of the cavity 76. The working fluid 78 may fill the gel structure 90 or a portion thereof. In operation, the working fluid 78 is heated by the housing 68 and the gel structure 90 further conducts heat from the housing through the working fluid 78. The heated working fluid 78 evaporates and travels through the gel structure 90 and exits through the vent tubes 72 to the ambient environment.

Turning to FIG. 15, the evaporative thermal management device 66 includes pressure relief valves 92 on the vent tubes 72. The pressure relief valves 92 allow for tuning of the saturation pressure and, therefore tuning of the boiling point or saturation temperature, of the working fluid 78. Using the pressure relief valves 92, the evaporative thermal management device 66 maintains the pressure of the cavity 76 at or below the set point of the pressure relief valves 92.

Figure 16:
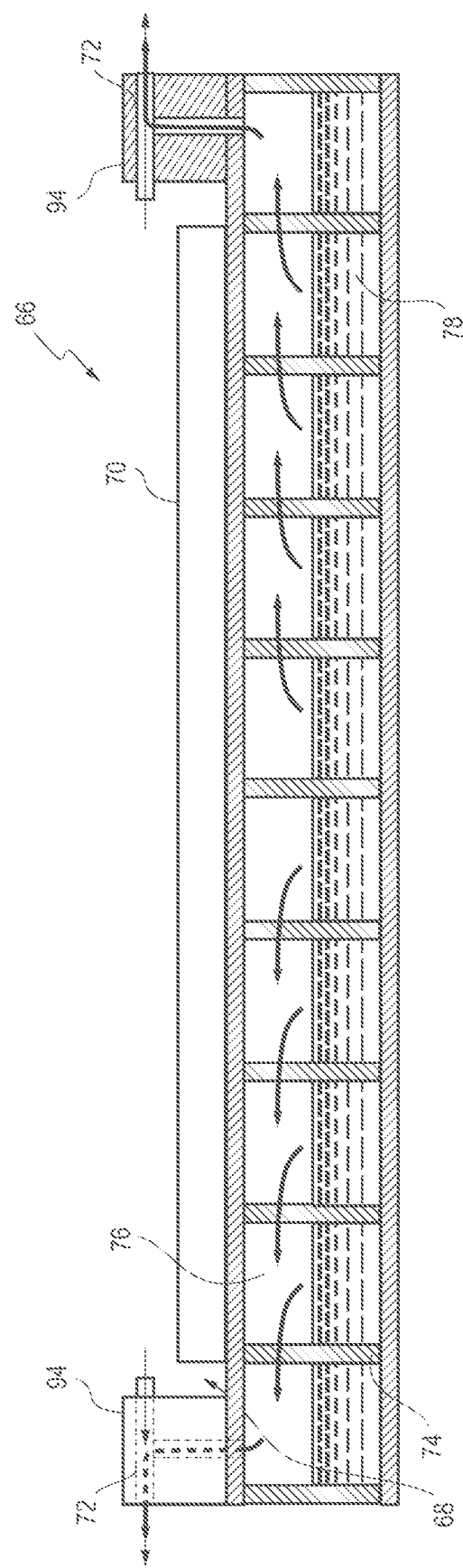
FIG. 16 is a schematic diagram of an embodiment of an evaporative thermal management device equipped with a venturi pump.

Turning to FIG. 16, the evaporative thermal management device 66 includes venturi pumps 94 on the vent tubes 72. The venturi pumps 94 control the pressure of the cavity 76. In particular, the venturi pumps 94 blow motive air across the vent tubes 72 to actively lower the pressure of the cavity 76. Accordingly, the pressure of the cavity 76 may be adjusted by the flow rate of the motive air. By lowering the operating pressure of the cavity 76, the venturi pumps 94 may also lower the boiling point of the working fluid 78 that is held in the cavity 76. In a low-pressure environment, the working fluid 78 is able to evaporate at a lower temperature and maintains the substrate 70 at a lower temperature.

Although pressure relief valves 92 and venturi pumps 94 are shown as the pressure regulating devices in FIGS. 15 and 16, it is contemplated that any number of suitable pressure regulating devices may be used to control the pressure in the cavity 76.

Figure 17:
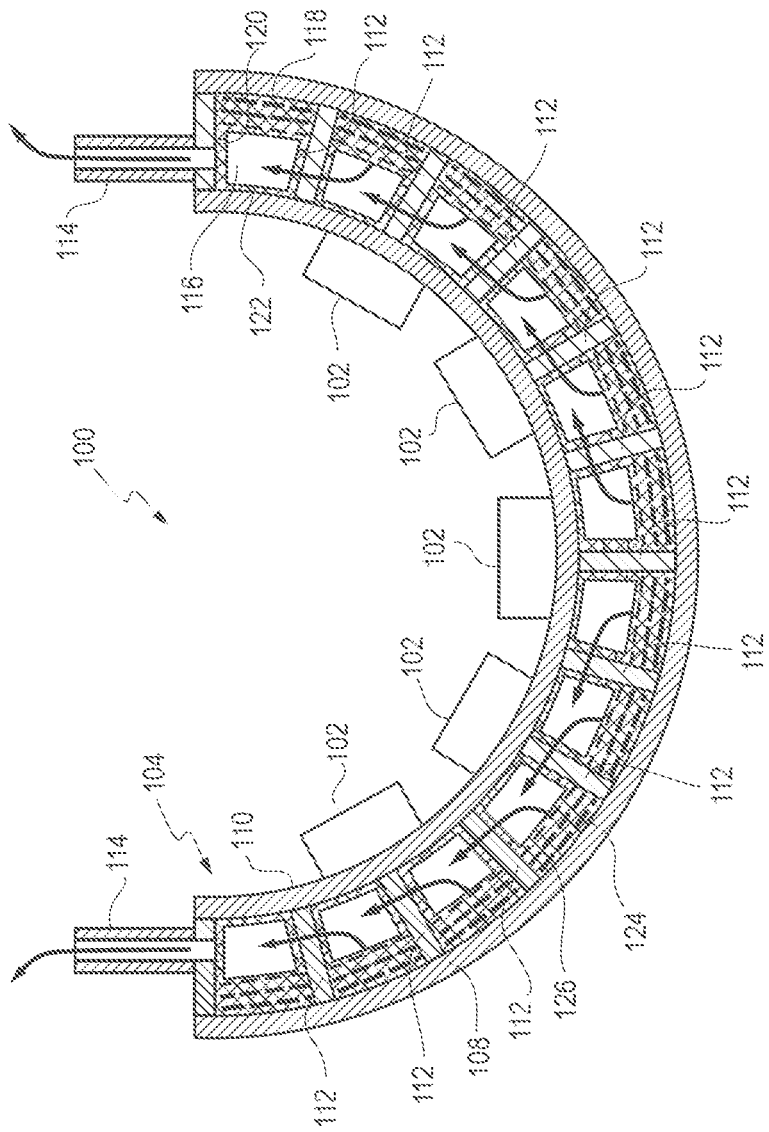
FIG. 17 is a schematic diagram of an embodiment of an evaporative thermal management device having a non-planar housing.
Figure 18:
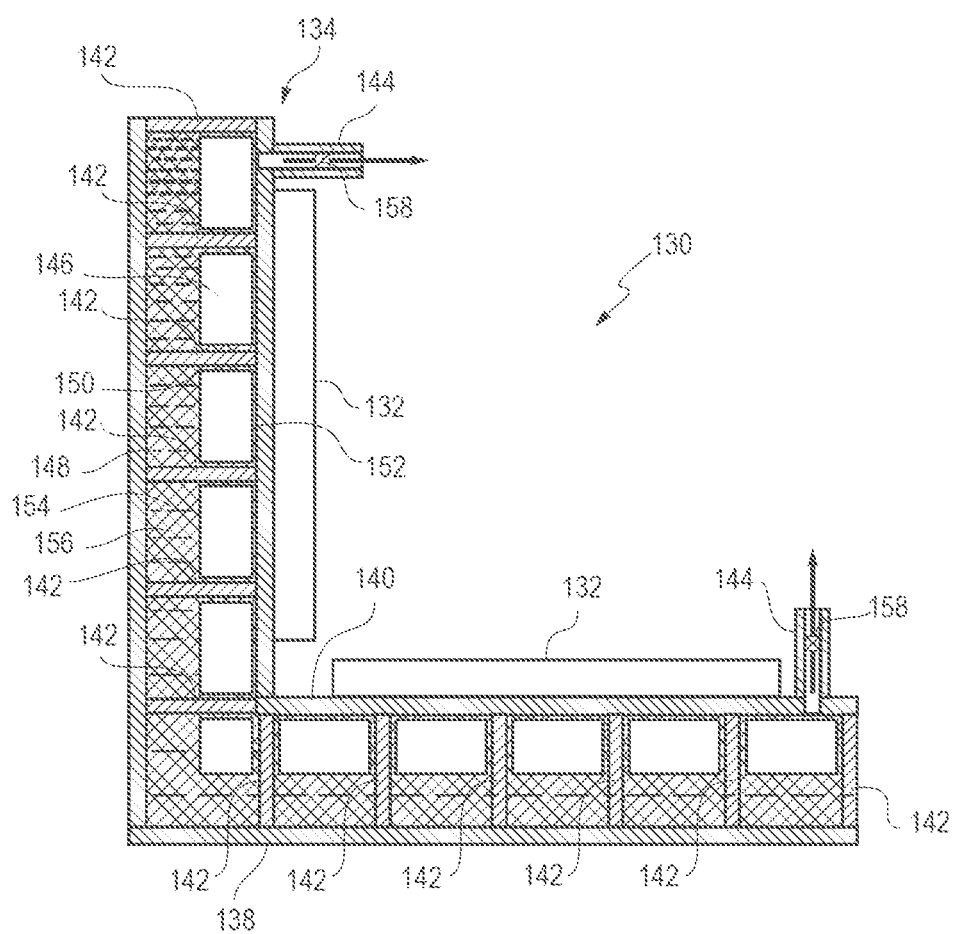
FIG. 18 is a schematic diagram of an embodiment of an evaporative thermal management device having an angled housing.

FIGS. 17 and 18 illustrate additional housing configurations for the evaporative thermal management devices described herein. FIG. 17 illustrates a non-planar housing configuration, and FIG. 18 illustrates an angled housing configuration. However, it is to be understood that the evaporative thermal management devices described herein may employ other housing configurations to accommodate the shape of a particular substrate or to accommodate the space limitations of a particular cooling application.

FIG. 17 depicts an evaporative thermal management device 100 having a non-planar housing 104. The non-planar housing 104 is in thermal communication with a plurality of substrates 102. The non-planar housing 104 comprises an arcuate base case 108 and an arcuate top case 110. The non-planar housing 104 further includes a plurality of supports 112, which extend from the arcuate base case 108 to the arcuate top case 110 and form a cavity 116 therebetween. The cavity 116 holds a working fluid 126. A porous structure 124 lines the floor 118, the walls 120, and the ceiling 122 of the cavity 116. The porous structure 124 forms a porous domain within the cavity 116. The porous structure 124 helps to confine the working fluid 126 to the floor 118, the walls 120, and the ceiling 122 of the cavity 116. Two vents 114 are disposed at end portions of the non-planar housing 104. The vents 114 are in fluid communication with the environment surrounding the non-planar housing 104. The vents 114 are configured to release evaporated working fluid 126 from the non-planar housing 104 during operation of the evaporative thermal management device 100.

FIG. 18 depicts an evaporative thermal management device 130 having an angled housing 134. The angled housing 134 is formed in an L-shape. The non-planar housing 104 is in thermal communication with substrates 132. The angled housing 134 comprises an angled base case 138 and an angled top case 140. The angled housing 134 further includes a plurality of supports 142, which extend from the angled base case 138 to the angled top case 140 and form a cavity 146 therebetween. The cavity 146 holds a working fluid 156. A porous structure 154 lines the floor 148, walls 150, and ceiling 152 of the cavity 146. The porous structure 154 forms a porous domain within the cavity 146. The porous structure 154 helps to confine the working fluid 156 to the floor 148, the walls 150, and the ceiling 152 of the cavity 146. Two vents 144 are disposed at end portions of the angled housing 134.

The vents 144 each include a valve 158. In some approaches, the valves 158 are squib valves. The valves 158 may be configured place the vents 144 in fluid communication with the environment surrounding the angled housing 134. In some approaches, the valves 158 may open to initiate operation of the evaporative thermal management device 130. When the vents 144 are in fluid communication with the environment surrounding the angled housing 134, the vents 144 release evaporated working fluid 156 from the angled housing 134 and expose the cavity 146 to the pressure of the environment surrounding the angled housing 134.

In some embodiments, in any of the evaporative thermal management devices described here, instead of venting the evaporated working fluids to the ambient environment, the evaporated working fluids may be used in one or more secondary cooling applications. In this manner, the evaporated working fluid may be repurposed and used as a cooling fluid for other secondary substrates. The evaporated working fluid may be separated and/or collected from the vents of the evaporative thermal management device and directed another substrate or system. The vents of the evaporative thermal management devices may be directly coupled to the secondary substrate or system.

In some approaches, the vents of the thermal management devices described herein may be coupled to additional tubes, pipes, or other conduits to direct the evaporated working fluid to the secondary substrate or system. In some examples, the tubes, pipes, or other conduits may be disposed inside of a cold plate. The cold plate may be in thermal communication with the secondary substrate or system. In this manner, the evaporated working fluid flowing through the tubes, pipes, or other conduits may be used to cool the secondary substrate or system.

Figure 19:
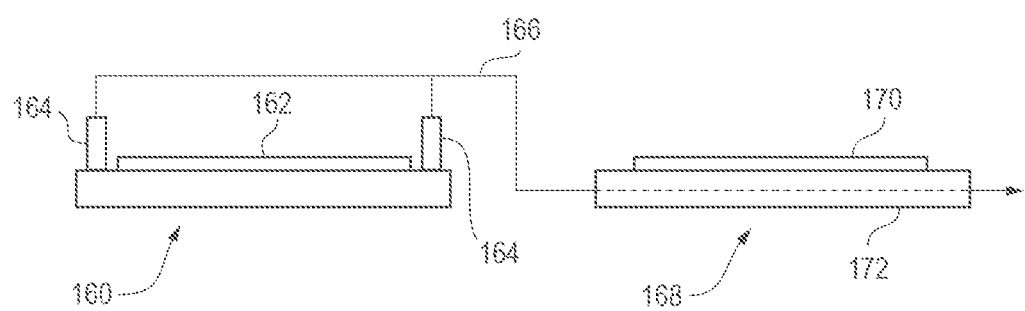
FIG. 19 is a schematic diagram of an embodiment of an evaporative thermal management device coupled to a secondary substrate.

Turning to FIG. 19, in one approach, an evaporative thermal management device 160 is coupled to a secondary system 168. The evaporative thermal management device 160 may be any one of the evaporative thermal management devices described herein. The evaporative thermal management device 160 is in thermal communication with a primary substrate 162. The primary substrate 162 may be any heat producing substrate. The evaporative thermal management device 160 includes vents 164. The vents 164 are coupled to tubes 166 and collect evaporated working fluid from the evaporative thermal management device 160 and direct the evaporate working fluid to the secondary system 168. The secondary system 168 includes a cold plate 172 and a secondary substrate 170 that is in thermal communication with the cold plate 172. The secondary substrate 170 may be any heat producing substrate.

In operation, the evaporative thermal management device 160 cools the primary substrate 162. Heat from the primary substrate 162 heats and evaporates a working fluid that is housed within the evaporative thermal management device 160. The evaporated working fluid exits the evaporative thermal management device 160 through the vents 164. The evaporated working fluid then flows from the vents 164 into tubes 166. The tubes 166 direct the evaporated working fluid through the cold plate 172 to cool the secondary substrate 170.

Applications of the evaporative thermal management devices described herein are illustrated in the following examples.

Example 1

In one exemplary application, the evaporative thermal management device 10 of FIG. 1 is used to maintain a substrate 12 at or below a threshold temperature of 70° C. The substrate 12 is placed in thermal communication contact with the evaporative thermal management device 10. No pressure regulating device is employed on the vents 28 of the evaporative thermal management device 10. Therefore, when the evaporative thermal management device 10 is used at sea level, the operating pressure of the evaporative thermal management device 10 is about 1 atm. To maintain the substrate 12 at or below the threshold temperature of 70° C., methanol is used as the working fluid 30. The boiling point of methanol at a pressure of 1 atm is about 65° C. In operation, when the vents 28 are open, the operating pressure of the device is brought to 1 atm and the methanol evaporates, maintaining the temperature of the substrate 12 at about 65° C.

Example 2

In another exemplary application, the evaporative thermal management device 10 of FIG. 1 is used to maintain a substrate 12 at or below a threshold temperature of 75° C. The substrate 12 is placed in thermal communication contact with the evaporative thermal management device 10. No pressure regulating device is employed on the vents 28 of the evaporative thermal management device 10. Therefore, when the evaporative thermal management device is used at about 30,000 feet above sea level, the operating pressure of the thermal management device is about 0.29 atm. To maintain the substrate 12 at or below the threshold temperature of 75° C., water is used as the working fluid 30. The boiling point of water at a pressure of 0.29 atm is about 71° C. In operation, when vents 28 are open, the operating pressure of the evaporative thermal management device 10 is brought to about 0.29 atm and the water evaporates, maintaining the temperature of the substrate at about 71° C.

Example 3

In another exemplary application, the evaporative thermal management device 66 of FIG. 13 is used to maintain a substrate 70 at or below a threshold temperature of about 82° C. The evaporative thermal management device 66 employs water as the working fluid 78. To maintain the substrate at the threshold temperature of about 82° C., the venturi pump 94 is used to adjust the pressure of the cavity 76 at about 0.5 atm. By lowering the operating pressure of the evaporative thermal management device 66 to about 0.5 atm, the venturi pump 94 lowers the boiling point of water to about 82° C. The temperature of the substrate 70 is therefore maintained at about 82° C.

Example 4

In another exemplary application, the pressure regulating devices in the evaporative thermal management device 66 are pressure relief valves 92 (see FIG. 15). The pressure relief valves provide a constant interior pressure and therefore a constant working fluid 78 temperature as exterior ambient pressure changes, for example, due to changes in altitude.

Further aspects of the invention are provided by the subject matter of the following clauses:

An evaporative thermal management device comprising: a housing having a base case; a top case positioned opposite the base case; a plurality of supports extending from the base case to the top case and forming a cavity therebetween, the cavity having an operating pressure associated therewith; at least one vent coupled to the housing and in fluid communication with the cavity; and a working fluid disposed in the cavity, the working fluid having a boiling point at or below a threshold temperature associated with a substrate at the operating pressure; wherein evaporation of the working fluid controls a temperature of the substrate when the cavity is at the operating pressure, and the evaporated working fluid is vented to an ambient environment surrounding the housing through the at least one vent.

The evaporative thermal management device of any preceding clause, wherein the at least one vent includes a pressure regulating device that controls a pressure within the housing to adjust the boiling point of the working fluid.

The evaporative thermal management device of any preceding clause, wherein the at least one vent includes a vapor-liquid separator.

The evaporative thermal management device of any preceding clause, wherein at least one of the plurality of supports is a column.

The evaporative thermal management device of any preceding clause, wherein the support has a branched structure comprising a plurality of posts.

The evaporative thermal management device of any preceding clause further comprising: a porous domain disposed within the cavity for containment of the working fluid within the cavity.

The evaporative thermal management device of any preceding clause, wherein the porous domain is at least one of: a mesh and a gel.

The evaporative thermal management device of any preceding clause, wherein the porous domain is disposed on a bottom wall of the cavity.

The evaporative thermal management device of any preceding clause, wherein the porous domain is further disposed on one or more side walls of the cavity.

The evaporative thermal management device of any preceding clause, wherein the at least one vent includes a valve configured to open the at least one vent and place the at least one vent in fluid communication with the ambient environment.

The evaporative thermal management device of any preceding clause, wherein the operating pressure is a pressure of the ambient environment.

An evaporative thermal management system comprising: a substrate having a threshold temperature associated therewith; an evaporative thermal management device in thermal communication with the substrate, the evaporative thermal management device comprising: a housing having a base case, a top case, and a plurality of supports extending from the base case to the top case and forming a cavity therebetween, the cavity having an operating pressure associated therewith; at least one vent coupled to the housing and in fluid communication with the cavity; and a working fluid disposed in the cavity, the working fluid having a boiling point at or below a threshold temperature associated with a substrate at the operating pressure, wherein evaporation of the working fluid controls the temperature of the substrate when the cavity is at the operating pressure, and the evaporated working fluid is vented to an ambient environment surrounding the housing through the at least one vent.

The evaporative thermal management system of any preceding clause, wherein the plurality of supports are sized to mechanically support the weight of the substrate.

The evaporative thermal management system of any preceding clause, wherein the top case of the housing is in thermal communication with the substrate.

The evaporative thermal management system of any preceding clause, wherein the bottom case of the housing is in thermal communication with the substrate.

A method of thermal management for a substrate using an evaporative thermal management device, the evaporative thermal management device having a housing with a base case, a top case positioned opposite the base case, a plurality of supports extending from the base case to the top case and forming a cavity therebetween, and at least one vent coupled to the housing and in fluid communication with the cavity, the method comprising: placing the evaporative thermal management device in thermal communication with the substrate; associating an operating pressure with the cavity; filling at least a portion of the cavity with a working fluid, the working fluid having a boiling point at or below a threshold temperature associated with the substrate at the operating pressure; exposing the cavity to the operating pressure; evaporating the working fluid to control the temperature of the substrate; and venting the evaporated working fluid to an ambient environment surrounding the housing via the at least one vent.

The method of any preceding clause further comprising the step of: controlling the boiling point of the working fluid via a pressure regulating device on the at least one vent.

The method of claim any preceding clause, wherein the step of exposing further comprises adjusting the pressure of the cavity using the pressure regulating device.

The method of any preceding clause further comprising the step of: opening a valve on the at least one vent to place the cavity in fluid communication with the ambient environment.

The method of any preceding clause, further comprising the step of: using the evaporated working fluid in a secondary cooling application.

It will be understood that various changes in the details, materials, and arrangements of parts and components which have been herein described and illustrated to explain the nature of the dynamic seals between moving components and stationary components may be made by those skilled in the art within the principle and scope of the appended claims. Furthermore, while various features have been described with regard to particular embodiments, it will be appreciated that features described for one embodiment also may be incorporated with the other described embodiments.

What is claimed is:

1. An evaporative thermal management device comprising:
    a housing having a first case;
    a second case positioned opposite the first case;
    a plurality of supports extending from the first case to the second case and forming a cavity therebetween, the cavity having an operating pressure associated therewith;
    at least one vent coupled to the housing and in fluid communication with the cavity; and
    a working fluid disposed in the cavity;
    wherein evaporation of the working fluid controls a temperature of a substrate when the cavity is at the operating pressure, and the evaporated working fluid forming in a space in the cavity between the working fluid and the substrate and is vented to an ambient environment surrounding the housing through the at least one vent.

2. The evaporative thermal management device of claim 1, wherein the at least one vent includes a pressure regulating device that controls a pressure within the housing to adjust a boiling point of the working fluid.

3. The evaporative thermal management device of claim 1, wherein the at least one vent includes a vapor-liquid separator.

4. The evaporative thermal management device of claim 1, wherein at least one of the plurality of supports is a column.

5. The evaporative thermal management device of claim 1, wherein the support has a branched structure comprising a plurality of posts.

6. The evaporative thermal management device of claim 1 further comprising: a porous domain disposed within the cavity for containment of the working fluid within the cavity.

7. The evaporative thermal management device of claim 6, wherein the porous domain is at least one of: a mesh and a gel.

8. The evaporative thermal management device of claim 6, wherein the porous domain is disposed on a bottom wall of the cavity.

9. The evaporative thermal management device of claim 8, wherein the porous domain is further disposed on one or more side walls of the cavity.

10. The evaporative thermal management device of claim 1, wherein the at least one vent includes a valve configured to open the at least one vent and place the at least one vent in fluid communication with the ambient environment.

11. The evaporative thermal management device of claim 1, wherein the operating pressure is a pressure of the ambient environment.

12. An evaporative thermal management system comprising:
    a substrate having a threshold temperature associated therewith;
    an evaporative thermal management device in thermal communication with the substrate, the evaporative thermal management device comprising:

a housing having a first case, a second case, and a plurality of supports extending from the first case to the second case and forming a cavity therebetween, the cavity having an operating pressure associated therewith;

at least one vent coupled to the housing and in fluid communication with the cavity; and a working fluid disposed in the cavity;

wherein evaporation of the working fluid controls the temperature of the substrate when the cavity is at the operating pressure, and the evaporated working fluid is vented from a space between the working fluid and the substrate to an ambient environment surrounding the housing through the at least one vent.

13. The evaporative thermal management system of claim 12, wherein the plurality of supports are sized to mechanically support the substrate.

14. The evaporative thermal management system of claim 12, wherein the second case of the housing is in thermal communication with the substrate.

15. The evaporative thermal management system of claim 12, wherein the first case of the housing is in thermal communication with the substrate.

16. A method of thermal management for a substrate using an evaporative thermal management device, the evaporative thermal management device having a housing with a first case, a second case positioned opposite the first case, a plurality of supports extending from the first case to the second case and forming a cavity therebetween, and at least one vent coupled to the housing and in fluid communication with the cavity, the method comprising:

placing the evaporative thermal management device in thermal communication with the substrate;

associating an operating pressure with the cavity;

filling at least a portion of the cavity with a working fluid, the working fluid having a boiling point at or below a threshold temperature associated with the substrate at the operating pressure;

exposing the cavity to the operating pressure;

evaporating the working fluid into a space in the cavity between the working fluid and the substrate to control the temperature of the substrate; and venting the evaporated working fluid to an ambient environment surrounding the housing via the at least one vent.

17. The method of claim 16 further comprising the step of:
controlling the boiling point of the working fluid via a pressure regulating device on the at least one vent.

18. The method of claim 17, wherein the step of exposing further comprises adjusting the pressure of the cavity using the pressure regulating device.

19. The method of claim 16 further comprising the step of:
opening a valve on the at least one vent to place the cavity in fluid communication with the ambient environment.

20. The method of claim 16, further comprising the step of:
using the evaporated working fluid in a secondary cooling application.

* * * * *